(12) United States Patent
Murai et al.

(10) Patent No.: US 9,018,656 B2
(45) Date of Patent: Apr. 28, 2015

(54) LIGHT EMITTING DEVICE

(75) Inventors: Akihiko Murai, Yao (JP); Masaharu Yasuda, Takarazuka (JP); Tomoya Iwahashi, Ibaraki (JP); Kazuyuki Yamae, Ikoma (JP)

(73) Assignee: Panasonic Corporation, Osaka (JP)

( * ) Notice: Subject to any disclaimer, the term of this patent is extended or adjusted under 35 U.S.C. 154(b) by 244 days.

(21) Appl. No.: 13/201,853

(22) PCT Filed: Feb. 23, 2010

(86) PCT No.: PCT/JP2010/052749
§ 371 (c)(1),
(2), (4) Date: Aug. 16, 2011

(87) PCT Pub. No.: WO2010/098313
PCT Pub. Date: Sep. 2, 2010

(65) Prior Publication Data
US 2011/0297989 A1 Dec. 8, 2011

(30) Foreign Application Priority Data
Feb. 24, 2009 (JP) ................................. 2009-041491

(51) Int. Cl.
| H01L 33/00 | (2010.01) |
| H01L 33/38 | (2010.01) |
| H01L 33/40 | (2010.01) |
| H01L 33/62 | (2010.01) |
| H01L 33/10 | (2010.01) |
| H01L 33/44 | (2010.01) |
| H01L 33/64 | (2010.01) |

(52) U.S. Cl.
CPC ............ *H01L 33/387* (2013.01); *H01L 33/405* (2013.01); *H01L 33/44* (2013.01); *H01L 33/62* (2013.01); *H01L 33/647* (2013.01); *H01L 33/10* (2013.01); *H01L 2924/0002* (2013.01)

(58) Field of Classification Search
USPC .............................................. 257/79, 98, 103
See application file for complete search history.

(56) References Cited

U.S. PATENT DOCUMENTS

| 6,903,376 B2 | 6/2005 | Shen et al. |
| 7,804,104 B2 * | 9/2010 | Lin et al. .......................... 257/98 |

(Continued)

FOREIGN PATENT DOCUMENTS

| JP | 2004-6893 A | 1/2004 |
| JP | 2005-347728 A | 12/2005 |
| JP | 2007-251130 A | 9/2007 |
| JP | 2007-258276 A | 10/2007 |

OTHER PUBLICATIONS

International Search Report for the Application No. PCT/JP2010/052749 mailed Mar. 30, 2010.

*Primary Examiner* — Benjamin Sandvik
(74) *Attorney, Agent, or Firm* — McDermott Will & Emery LLP

(57) ABSTRACT

The light emitting device comprises a mounting substrate and an LED chip which comprises an n-type nitride semiconductor layer, a nitride light emission layer on the n-type nitride semiconductor layer, p-type nitride semiconductor layer on the nitride light emission layer, an anode electrode opposite of the nitride light emission layer from the p-type nitride semiconductor layer, and a cathode electrode on the n-type nitride semiconductor layer. The mounting substrate has a patterned conductor which is connected to the cathode electrode through a bump and also connected to the anode electrode through a bump. The LED chip further comprises one or more dielectric layer between the p-type nitride semiconductor layer and the anode electrode to have an arrangement which resembles an island. The p-type nitride semiconductor layer has a first region which is overlapped with the bump. The dielectric layer is not formed within the first region.

12 Claims, 3 Drawing Sheets

(56) References Cited

U.S. PATENT DOCUMENTS

| | | |
|---|---|---|
| 2002/0190260 A1 | 12/2002 | Shen et al. |
| 2005/0211997 A1* | 9/2005 | Suehiro et al. .................. 257/88 |
| 2005/0269588 A1 | 12/2005 | Kim et al. |
| 2007/0096130 A1* | 5/2007 | Schiaffino et al. .............. 257/98 |
| 2007/0221927 A1 | 9/2007 | Chen et al. |
| 2008/0185606 A1* | 8/2008 | Sano et al. ....................... 257/98 |
| 2010/0072487 A1* | 3/2010 | Tsai et al. ....................... 257/86 |

* cited by examiner

LIGHT EMITTING DEVICE

TECHNICAL FIELD

This invention relates light emitting devices which comprises an LED chip (light emission diode chip). Particularly, this invention relates to a light emitting device which comprises an anode electrode, a p-type nitride semiconductor layer, and a dielectric layer which is located between the anode electrode and the p-type nitride semiconductor layer. The dielectric layer is located in a predetermined region which is along a plane perpendicular to a thickness direction of the LED chip.

BACKGROUND ART

Conventionally, research of a lot of LED chip is conducted. The prior LED chip comprises a light emission layer, an anode electrode, and a cathode electrode. The light emission layer is made of nitride semiconductor material such as GaN, InGaN, AlGaN, and InAlGaN. The anode electrode is disposed on one surface in a thickness direction of the light emission layer, and the cathode electrode is disposed on the other surface in the thickness direction of the light emission layer. The LED chip is flip-chip mounted on the mounting substrate. In addition, the research of improving the light extraction efficiency of the LED chip is conducted. In order to improve the light extraction efficiency of the LED chip, the research and development of the LED chip having a structure which is designed so as not to prevent the anode electrode from being absorbed by the anode electrode is conducted. In order to improve the light extracting efficiency of the LED chip, the LED chip having a structure of preventing absorption of the light in the anode is researched and developed. The above mentioned LED chip is disclosed in patent literature 1 which is mentioned below.

The patent literature 1 discloses the LED chip which has a structure shown in FIG. 3. As will be understood from FIG. 3, LED chip comprises a light transmissive substrate 1, an n-type nitride semiconductor layer 2, a nitride light emission layer 3, a p-type nitride semiconductor layer 3; the light transmissive substrate 1 is made of sapphire substrate; the n-type nitride semiconductor layer 2, the nitride light emission layer 3, and the p-type nitride semiconductor layer 4 are located on one side surface of the light transmissive substrate 1. The anode electrode 7 is opposite of the nitride light emission layer 3 from the p-type nitride semiconductor layer 4. In addition, the cathode electrode 8 is located on the same side of the n-type nitride semiconductor layer 2 as the nitride light emission layer 3. Furthermore, the LED chip comprises a first transparent conductive film 9a, a second transparent conductive film 9b, a plurality of low refractive index dielectric layers 10P, a light reflective conductive film 11, and a barrier metal layer 14. The first transparent conductive film 9a, the second transparent conductive film 9b, a plurality of the low refractive index dielectric layers 10P, the light reflective conductive film 11, and the barrier metal layer 14 are interposed between the p-type nitride semiconductor layer 3 and the anode electrode 7. The first transparent conductive film 9a is formed on the p-type nitride semiconductor layer 4. The second transparent conductive film 9b is formed on the first transparent conductive film 9a. The low refractive index dielectric layers 10P are made of material which has a refractive index which is lower than a refractive index of the p-type nitride semiconductor layer 4. The low refractive index dielectric layers 10P are partially stacked on the second transparent conductive film 9b. The low refractive index dielectric layers 10P are configured to reflect the light which is emitted from the nitride light emission layer 3. The light reflective conductive film 11 is shaped to cover the low refractive index dielectric layers 10P and the second transparent conductive film 9b. The light reflective conductive film 11 is configured to reflect the light which is emitted from the nitride light emission layer 3. The barrier metal layer 14 is formed on the light reflective conductive film 11. That is to say, the LED chip of FIG. 3 has a light extracting surface in one surface in the thickness direction of the nitride light emission layer 3, and a first surface which is opposite of the light extracting surface from the nitride light emission layer 3. In addition, the LED chip is provided at its first surface with the low refractive index dielectric layers 10P. The nitride light emission layer 3 is configured to emit the light toward both the light extracting surface and the anode electrode 7. When the nitride light emission layer 3 emits the light toward the anode electrode 7, the light is reflected by the low refractive index dielectric layers 10P and the light reflective conductive film 11. The low refractive index dielectric layers 10P and the light reflective conductive film 11 are configured to reflect the light toward the light extracting surface. It is noted that the arrowed line C shown in FIG. 3B discloses one example of a path of the light which is emitted from the nitride light emission layer 3, which is taken in the low refractive index dielectric layers 10P, and which is reflected by the low refractive index dielectric layers.

The above mentioned first transparent conductive film 9a has a thickness of 2 nm to 10 nm. The first transparent conductive film 9a is made of material such as Ni, Pd, Pt, Cr, Mn, Ta, Cu, Fe, or alloy including at least one of them. The second transparent conductive film 9b is made of one of the materials selected from ITO, IZO, ZnO, $In_2O_3$ $SnO_2$ $Mg_xZn_{1-x}O$ ($x \leq 0.5$), amorphous AlGaN, GaN, SiON. In addition, the light reflective conductive film 11 is made of material such as Ag, Al, and Rh. The anode electrode 7 is made of metal material of Au. The barrier metal layer 14 is made of material of Ti.

Each one of the low refractive index dielectric layers 10P which are mentioned above has a cross section which is perpendicular to the thickness direction of the LED chip; the cross section of the low refractive index dielectric layer 10P has a circular shape. In addition to the above, each one of the low refractive index dielectric layers 10P is disposed on the second transparent conductive film 9b such that the low refractive index dielectric layers 10P are arranged in the two dimensional array. More specifically, each one of the low refractive index dielectric layers 10P is disposed on a lattice point of a square lattice along the plane which is perpendicular to the thickness direction of the LED chip. That is, FIG. 3 discloses the LED chip which comprises a plurality of the low refractive index dielectric layers 10P; the low refractive index dielectric layers 10P is arranged along the plane in parallel with the nitride light emission layer 3; each one of the low refractive index dielectric layers 10P has an arrangement which resembles the island to be isolated from each other.

In addition to the above mentioned configuration, the low refractive index dielectric layers 10P comprise alternating layers of two kinds of the dielectric layers; the two kinds of the dielectric layers have electrical insulation properties and are different in the refractive index from each other, whereby each one of the low refractive index dielectric layer 10P has a periodic structure that the refractive index is periodically changed. The low refractive index dielectric layers 10P are made of material such as $SiO_2$, $ZrO_2$, $TiO_2$, $Al_2O_3$, $Si_3N_4$, and AlN.

PATENT LITERATURE

Patent literature 1: Japanese patent application publication No. 2007-258276A

Problem to be Resolved by the Invention

In the light emitting device comprising the mounting substrate and the LED chip AA which has a structure shown in FIG. 3 and which is flip chip mounted on the mounting substrate, when the nitride light emission layer 3 emits the light to the n-type nitride semiconductor layer 2, the light exits from the light extracting surface through the light transmissive substrate 1. In addition, when the nitride light emission layer emits the light toward the p-type nitride semiconductor layer 4, the light is reflected by the reflection member which is realized by a plurality of the low refractive index dielectric layers 10P and the light reflective conductive film 11. With this configuration, the light which is emitted from the nitride light emission layer 3 is efficiently reflected toward the anode electrode 7. Therefore, this configuration makes it possible to improve the light extracting efficiency of the light which is extracted from the light extracting surface of the LED chip, whereby it is possible to improve the luminance efficiency. In addition to the above, LED chip shown in FIG. 3 comprises a plurality of the low refractive index dielectric layers 10P; a plurality of the low refractive index dielectric layers are isolated from each other to have the arrangement which resembles the island shape. Therefore, this configuration makes it possible to prevent the operation voltage from being increased due to the low refractive index dielectric layers 10P. As a result, this configuration makes it possible to prevent the increase of the operation voltage and also to improve the light extracting efficiency at the same time.

However, the above mentioned light emitting device comprises a plurality of the low refractive index dielectric layers 10P which are arranged in the two dimensional array on the second transparent conductive film 9b such that a plurality of the low refractive index dielectric layers 10P have arrangement which resembles the islands which are isolated from each other. Therefore, the anode electrode 7 is provided at its one surface with a first region which is overlapped with the bumps. In addition to this, the low refractive index dielectric layers 10P are also disposed on the first region. The low refractive index dielectric layers 10P are made of dielectric material having low heat conductive properties, compared with Au and GaN. (SiO$_2$ has the heat conductive property of 0.55 W/mK. Au has the heat conductive property of 320 W/mK. GaN has the heat conductive property of 130 W/mK.) This configuration invites the decrease of the heat radiating property of releasing the heat from the LED chip to the mounting substrate through the bumps. This results in the decrease of the luminescent efficiency of the LED chip. In addition to this, when the LED chip AA is flip chip mounted on the mounting substrate, the LED chip receives the impact. This impact causes the debonding at an interface between the low refractive index dielectric layers 10P and the second transparent conductive film 9b. Similarly, the impact applied to the LED chip causes the debonding at an interface between the low refractive index dielectric layers 10P and the light reflective conductive film 11. This is caused by the low bonding force of the low refractive index dielectric layers 10P to the films which is in contact with the low refractive index dielectric layers 10P. (The film which is in contact with the low refractive index dielectric layers 10P is such as the second transparent conductive film 9b and the light reflective conductive film 11.)

This invention is achieved to solve the above problem. This invention has an object of producing the light emitting device which is improved its heat radiation property and its luminescent efficiency.

Means of Solving the Problem

In order to solve the above problem, this invention discloses the light emitting device which comprises an LED chip and a mounting substrate. The LED chip comprises an n-type nitride semiconductor layer, a nitride light emission layer, a p-type nitride semiconductor layer, an anode electrode, and a cathode electrode. The n-type nitride semiconductor layer has a first surface. The nitride light emission layer is formed on the first surface of the n-type nitride semiconductor layer. The p-type nitride semiconductor layer is formed on the nitride light emission layer. The anode electrode is located in a position opposite of the nitride light emission layer from the p-type nitride semiconductor layer. The cathode electrode is formed on the first surface of the n-type nitride semiconductor layer. The LED chip is mounted on the mounting substrate. The mounting substrate has a patterned conductor. The patterned conductor is connected to the cathode electrode through a bump, and is connected to the anode electrode through a bump. The LED chip comprises one or more dielectric layers which have an arrangement which resembles an island. The dielectric layer has a refractive index which is smaller than the refractive index of the p-type nitride semiconductor layer. The dielectric layer is located between the p-type nitride semiconductor and the anode electrode. The p-type nitride semiconductor layer has a first region which is overlapped with the bump. The dielectric layer is not overlapped with the first region.

This configuration makes it possible to improve the light extracting efficiency of the LED chip. In addition, this configuration makes it possible to decrease the thermal resistance between the LED chip and the mounting substrate. Therefore, it is possible to improve the heat radiation property.

It is preferred that the LED chip further comprises a transparent conductive film and a light reflective conductive film. The transparent conductive film is disposed between the p-type nitride semiconductor layer and the anode electrode. The transparent conductive film has a refractive index which is smaller than the refractive index of the p-type nitride semiconductor layer. The light reflective conductive film is formed between the light transmissive conductive film and the anode electrode. The one or more dielectric layers are partially formed on the transparent conductive film to have the arrangement which resembles the island. The dielectric layer is located between the transparent conductive film and the anode electrode.

This configuration also makes it possible to improve the light extracting efficiency of the LED chip. In addition, this configuration makes it possible to decrease the thermal resistance between the LED chip and the mounting substrate. Therefore, it is possible to improve the heat radiation property.

It is preferred that the first region is a plane which is perpendicular to the thickness direction of the p-type nitride semiconductor layer. The plane defined as the first region has a circular shape. In addition, the first region is overlapped with the bump in the thickness direction of the p-type nitride semiconductor layer.

In this case, it is possible to densely arrange the low refractive index dielectric layers, compared with a case where the low refractive index dielectric layers region has a shape which is rectangular shape in planar view. Therefore, this configuration makes it possible to improve the light extracting property of the LED chip.

It is preferred that the first region is a plane which is perpendicular to the thickness direction of the p-type nitride semiconductor layer. The plane which is defined by the first region has a circular shape. Consequently, the first region has an outer circumference. The first region is overlapped with the bump in the thickness direction of the p-type nitride semiconductor layer such that the bump is locate within the outer circumference of the first region.

BEST MODE FOR CARRYING OUT THE INVENTION

First Embodiment

Figure 1A:
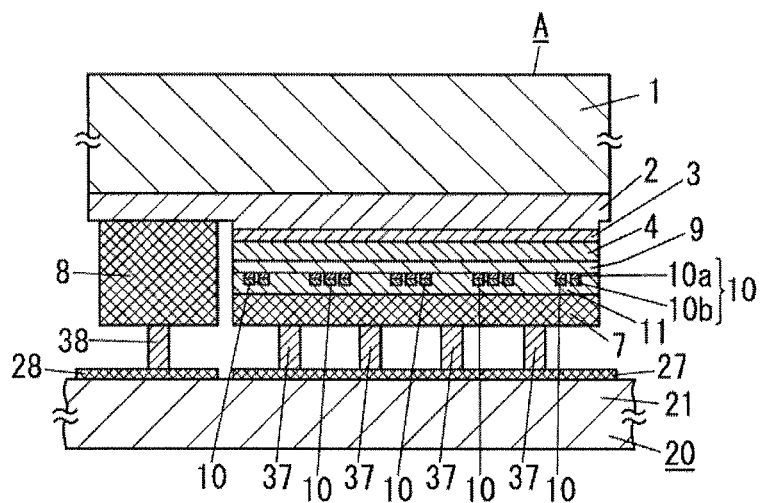
FIG. 1A shows a schematic side cross sectional view of the light emitting device of the first embodiment.

This embodiment discloses the light emitting device shown in FIG. 1A; the light emitting device comprises an LED chip A and a mounting substrate 20 which is configured to mount the LED chip A. It is noted that the upper-lower direction of FIG. 1A is equivalent to a thickness direction of the LED chip A, and also equivalent to a thickness direction of each one of the components of the LED chip A.

The mounting substrate 20 comprises an electrical insulation substrate 21, a patterned conductor 27, and a patterned conductor 28. The electrical insulation substrate 21 has an electrical insulation property, is made of a substrate of aluminum nitride which has a high heat conductivity, and is shaped to have a plate shape. The patterned conductor 27 and the patterned conductor 28 are formed on one surface of the electrical insulation substrate 21. The patterned conductor 27 and the anode electrode 7 are joined together by the bump 37, and the patterned conductor 28 and the cathode electrode 8 are joined together by the bump 28. It is noted that, although the mounting substrate 20 of this embodiment has a rectangular shape (square shape in this embodiment) in the planar view, the shape of the mounting substrate 20 is not limited to the square shape; it is possible to employ the mounting substrate 20 to have a rectangular shape, a circular shape, and a hexagonal shape.

The electrical insulation substrate 21 of the mounting substrate 20 also acts as the heat transfer plate which is configured to transfer the heat which is generated in the LED chip A. The electrical insulation substrate 21 may be exemplified by a glass epoxy substrate. The electrical insulation substrate 21 may be realized by the substrate having a heat conductivity which is higher than the heat conductivity of the substrate of the organic material. Therefore, the electrical insulation substrate 21 is not limited to the aluminum nitride substrate. The electrical insulation substrate 21 may be realized by the aluminum substrate, the porcelain enamel substrate, and the silicon substrate with the silicon dioxide film coat. The patterned conductors 27 and 28 are realized by the multilayered film which comprises a Cu film, Ni film, and Au film which is defined as a topmost layer.

Each one of the bumps 37 and 38 is made of material of Au. The bumps 37 and 38 are, so called, a stud bump; the bumps 37 and 38 are formed on the surface of each one of the patterned conductor by way of stud bump method. It is noted that the stud bump method is, in other words, the ball bump method. In addition to the above features, although the anode electrode 7 and the bumps 37 are joined together, the number of the bump 37 has no limits. However, there is a need to efficiently release the heat in the LED chip A. Therefore, it is preferred to employ a large number of the bumps 27. When the mounting of the LED chip A is performed, the LED chip is aligned to an accuracy of about plus or minus 5 micro meters, and receives the load by the ultrasonic sound wave. However, when the bumps 37 are realized by the stud bumps, a diameter of the circular shaped joint area of the bump 37 with respect to the anode electrode 7 is smaller than the diameter of a circular shaped joint area of the bump 37 with respect to the patterned conductor 27. In addition, when the bumps 38 are realized by the stud bumps, the diameter of the circular shaped joint area of the bump 38 with respect to the cathode electrode 8 is smaller than the diameter of the circular shaped joint area of the bump 38 with respect to the patterned conductor 28. In addition to the above, the bumps 37 and the bumps 38 may be produced by means of the plating method.

Figure 1B:
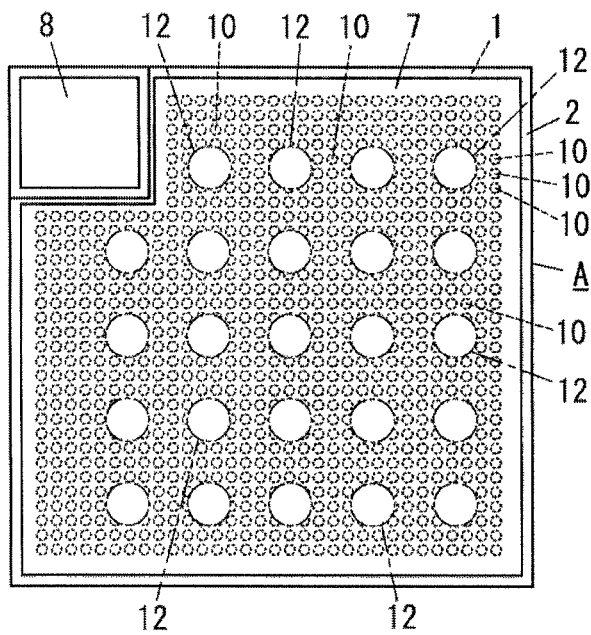
FIG. 1B shows a schematic bottom view of the light emitting device of the first embodiment.

As will be understood from FIG. 1A and FIG. 1B, the above mentioned LED chip A comprises the light transmissive substrate 1 and the n-type nitride semiconductor layer 2; the light transmissive substrate 1 is made of GaN substrate to have one surface which correspondes to the lower surface of the light transmissive substrate 1 shown in FIG. 1A; the n-type nitride semiconductor layer 2 which is realized by the n-type GaN layer is formed on the same side as the lower surface of the light transmissive substrate 1. As shown in FIG. 1A, n-type nitride semiconductor layer 2 has a lower surface which is equivalent to the first surface. Subsequently, the nitride light emission layer is formed on the lower surface of the n-type nitride semiconductor layer 2. The nitride light emission layer 3 has a quantum well structure. The p-type nitride semiconductor layer 4 which is realized by p-type GaN layer is formed on the nitride light emission layer 3. p-type nitride semiconductor layer 4 is opposite of the n-type nitride semiconductor layer 2 from the nitride semiconductor layer 4. That is, the LED chip A comprises the light transmissive substrate 1 and a stacking structure; the stacking structure comprises the n-type nitride semiconductor layer 2, the nitride light emission layer 3, and the p-type nitride semiconductor layer 4 which are located on the same side as the one surface of the light transmissive substrate 1. The n-type nitride semiconductor layer 2, the nitride light emission layer 3, and the p-type nitride semiconductor layer 4 are formed on the on the one surface of the light transmissive substrate 1 by means of the epitaxial growth method such as MOVPE method. Therefore, it is possible to employ the buffer layer between the light transmissive substrate 1 and the n-type nitride semiconductor layer 2. In addition, the crystal growth method of the n-type nitride semiconductor layer 2, the nitride light emission layer 3, and the p-type nitride semiconductor layer 4 is not limited to the MOVPE method. The n-type nitride semiconductor layer 2, the nitride light emission layer 3, and the p-type nitride semiconductor layer 4 may be formed by means of the crystal growth method such as hydride vaper phase epitaxy method, and molecular beam epitaxial method. In addition to the above, it is required for the light transmissive substrate 1 to have a transparency for passing the light which is emitted from the nitride light emission layer 3. That is, the light transmissive substrate 1 is exemplified by sapphire substrate, SiC substrate, and ZnO substrate.

In addition to the above, in the LED chip A, the anode electrode 7 is formed in a position opposite of the nitride light emission layer 3 from the p-type nitride semiconductor layer 4. The cathode electrode 8 is formed on the first surface of the n-type nitride semiconductor layer 2; the first surface is on the same side of the n-type nitride semiconductor layer 2 as the nitride light emission layer 3. The cathode electrode 8 is formed on the n-type nitride semiconductor layer 2 by way of the following steps. First, a first step is performed; in the first step, the n-type nitride semiconductor layer, the nitride light emission layer 3, and the p-type nitride semiconductor layer 4 are formed in order. According to the first step, the stacked film which comprises the n-type nitride semiconductor layer 2, the nitride light emission layer 3, and the p-type nitride semiconductor layer 4 is formed. Subsequent to the first step, the second step of etching a predetermined region of the stacked film is performed to etch the stacked film from the surface of the p-type nitride semiconductor layer 4 down to a mid portion of the n-type nitride semiconductor layer 2. Subsequent to the second step, the third step of forming the cathode on the surface of the n-type nitride semiconductor layer; the surface of the n-type nitride semiconductor layer is formed by the etching. In this manner, the n-type nitride semiconductor layer 2 comprises the first area and the second area. The first area corresponds to the area where the nitride semiconductor layer is formed. The second area corresponds to the area where the cathode electrode 8 is formed. The second area is spaced from the first area.

In the LED chip A, when the forward bias voltage is applied between the anode electrode 7 and the cathode electrode 8, the holes are injected into the p-type nitride semiconductor layer 4. In addition, when the forward bias voltage is applied between the anode electrode 7 and the cathode electrode 8, the electrons are injected into the n-type nitride semiconductor layer 2. When the electrons and the holes are injected into the nitride light emission layer 2, the electrons and the holes are recombined with each other in the nitride light emission layer 3. Consequently, the nitride light emission layer 2 emits the light.

Above mentioned n-type nitride semiconductor layer 2 is realized by the n-type GaN layer which is formed on the light transmissive substrate 1. However, n-type nitride semiconductor layer 2 is not limited to the single layer structure. That is, the nitride semiconductor layer 2 may be realized by the multilayer structure. For example, in a case where the light transmissive substrate 1 is realized by the sapphire substrate, it is possible to employ the multilayered n-type nitride semiconductor layer which comprises the buffer layer such as AlN layer and AlGaN layer on the one surface of the light transmissive substrate 1, the n-type AlGaN layer on the buffer layer, and the n-type GaN layer on the n-type GaN layer on the N-type AlGaN layer.

In addition, the nitride light emission layer 3 has a quantum well structure which comprises the barrier layers and the well layer which is interposed between the barrier layers; the barrier layers are realized by the GaN layers, and the well layer is realized by the InGaN layer. The InGaN layer has a composition which is determined to emit the light having the emission peak wavelength of 450 nm. However, the emission wavelength (the emission peak wavelength) of the nitride light emission layer 3 is not limited thereto. Furthermore, the nitride light emission layer 3 is not limited to have a quantum well structure of single quantum well structure; it is possible to employ the nitride light emission layer 3 to have a quantum well structure of multiple quantum well structure. In addition to the above, there is no necessary to employ the nitride light emission layer having the quantum well structure; it is possible to employ the nitride light emission layer having a single layer structure. In addition, it is only required for the nitride light emission layer 3 to use the material of the nitride semiconductor material. Therefore, it is possible for the nitride light emission layer 3 to use the material such as AlInGaN, AlInN, and AlGaN in order to obtain a desired emission wavelength.

Besides the above, the p-type nitride semiconductor layer 4 is realized by the p-type GaN layer which is formed on the nitride light emission layer 3. However, the p-type nitride semiconductor layer 4 is not limited to the single layer structure; it is possible to employ the p-type nitride semiconductor layer 4 having the multilayered structure. For example, it is possible to employ the p-type nitride semiconductor layer 4 having a first p-type semiconductor layer and a second p-type semiconductor layer; the first p-type semiconductor layer may be realized by the p-type AlGaN layer, and the second p-type semiconductor layer may be realized by p-type GaN layer.

In addition, the anode electrode 7 has a multilayered structure which comprises the first Au layer, the Ti layer, and the second Au layer; the first Au layer is disposed on the light reflective conductive film 11 which is explained below; the Ti layer is disposed on the first Au layer; the second Au layer is disposed on the Ti layer. In addition, the second Au layer which is located on the topmost of the multilayered structure is defined as the p-pad layer.

In addition, the cathode electrode 8 has a multilayered structure which comprises a Ti layer on the n-type nitride semiconductor layer 2 and Au layer on the Ti layer. In addition, Au layer acts as the n-pad layer. The Ti layer on the n-type nitride semiconductor layer 2 is provided to act as the ohmic contact layer with respect to the n-type nitride semiconductor layer 2. The ohmic contact layer may employ its material such as Ti, V, Al and alloy which comprises at least one of them.

The LED chip A further comprises a transparent conductive film 9, a light reflective conductive film 11, and low refractive index dielectric layers 10. The low refractive index dielectric layers 10 are, in other words, a dielectric layer. The transparent conductive film 9, the light reflective conductive film 11, and the low refractive index dielectric layers 10 are interposed between the p-type nitride semiconductor layer 4 and the anode electrode 7. The transparent conductive film 9 is disposed on one surface of the p-type nitride semiconductor layer. The transparent conductive film 9 is opposed of the nitride light emission layer 3 from the p-type nitride semiconductor layer. The transparent conductive film 9 is realized by the GZO (Ga doped ZnO) film which has a refractive index which is smaller than a refractive index of the p-type nitride semiconductor layer 6. The light reflective conductive film 11 is opposed of the p-type nitride semiconductor layer 2 from the transparent conductive film. Therefore, the light reflective conductive film 11 is interposed between the transparent conductive film 9 and the anode electrode. The light reflective conductive film 11 is realized by Ag film which has an electrical conductivity and a light reflectivity of reflecting the light which is emitted from the nitride light emission layer 3. The low refractive index dielectric layers 10 are interposed between the transparent conductive film 9 and the light reflective conductive film 11. The low refractive index dielectric layers 10 are disposed on the transparent conductive film 9 partially. Each one of the low refractive index dielectric layer 10 has a refractive index which is lower than the refractive index of the p-type nitride semiconductor layer 4. The low refractive index dielectric layers 10 have an arrangement which resembles the islands of being isolated from each other.

In this embodiment, the transparent conductive film 9 is realized by GZO which is formed to have a thickness of 10 nanometers. However, the transparent conductive film 9 is not limited its thickness thereto. In addition, this embodiment discloses the transparent conductive film 9 which is made of material of GZO. However, the transparent conductive film 9 is made of material which is selected from a group of GZO, AZO (Al doped ZnO), and ITO. The transparent conductive film 9 which is made of material which is selected from the above group makes it possible for the transparent conductive film 9 to establish the ohmic contact with respect to the p-type nitride semiconductor layer 6. In addition to the above, when the transparent conductive film 9 is formed by such as the GZO film, AZO film, and ITO film, the transparent conductive film 9 is formed by the following steps. First, the film such as GZO film, AZO film, and ITO film are formed by way of the electron beam evaporation method with assistance of $O_2$ gas. Subsequently, GZO film, AZO film, and ITO film is annealed in a mixed gas of $N_2$ gas and $O_2$ gas. This step makes it possible to obtain the transparent conductive film 9 having the extinction coefficient of about 0.001. Following explains the anneal condition for forming the GZO film as the transparent conductive film 9. $N_2$ gas and the $O_2$ gas are mixed to have a volume ratio of 95:5. The temperature for the anneal is 500 degree Celsius. The anneal is performed for five minutes. However, the transparent conductive film 9 is not limited its forming method and its forming condition to the above example. However, it is preferred to determine the forming method and the forming condition to form the transparent conductive film which has the extinction coefficient k of 0.003 or less. In addition, the transparent conductive film may be realized by, for example, a Pt film having a thickness of 0.1 nm. In addition, Pt film has a light transmissibility with regard to wavelength of 450 nm which becomes increases as the thickness of the Pt film decreases. In contrast, when the thickness of the Pt film is smaller than 0.6 nm, the light transmissibility of the Pt film decreases to about 95%. As a result, the Pt film having the thickness of 0.6 nm has the light reflectivity which is approximately equal to the light reflectivity of the light reflective conductive film 11 made of Ag film. Therefore, it is preferred to employ the Pt film having 0.5 nm or less when the Pt film is employed as the transparent conductive film 9.

In addition, in this embodiment, the light reflective conductive film 11 is realized by the Ag film having a thickness of 100 nm. However, the light reflective conductive film 11 is not limited its thickness thereto. It is possible to employ the Ag film having a thickness of 50 nm to 200 nm. In addition, the light reflective conductive film 11 is not limited its material to Ag. The light reflective conductive film 11 may be made of the material such as Al. However, the light reflective conductive film 11 is preferred to be made of Ag, compared with Al. This is because the light reflective conductive film 11 which is made of Ag has a high light reflectivity with respect to the light (ultraviolet light to visible light) emitted from the nitride light emission layer 3, compared with the light reflectivity of the light reflective conductive film which is made of Al.

In addition, the low refractive index dielectric layer 10 comprises the $SiO_2$ layer 10a and a $ZrO_2$ layer 10b; the $SiO_2$ layer 10a is formed on the transparent conductive film 9; the $ZrO_2$ layer 10b is formed on the $SiO_2$ layer 10a. It is noted that the low refractive index dielectric layer 10 is only required to comprise at least one $SiO_2$ layer 10a and at least one $ZrO_2$ layer 10b. However, it is possible to employ the low refractive index dielectric layer 10 which is realized by the stacked layer which comprises the first $SiO_2$ layer, $ZrO_2$ layer, and the second $SiO_2$ layer. In addition, the low refractive index dielectric layer 10 may be realized by a single layer which is made of material which is selected from at least one of $SiO_2$, $ZrO_2$, $Al_2O_3$, and $Y_2O_3$. The above mentioned stacked films and the single film make it possible for the low refractive index dielectric layer 10 to have the extinction coefficient of approximately zero. Therefore, it is possible to prevent an absorption loss of the light in the low refractive index dielectric layer 10. It is noted that $SiO_2$ has a refractive index of 1.46 and $ZrO_2$ has a refractive index of 1.97. $Al_2O_3$ has the refractive index of 1.7 to 1.9. $Y_2O_3$ has the refractive index of 1.8 to 2.0. Furthermore, the low refractive index dielectric layer 10 is not limited its material having the low refractive index, compared with the refractive index of the transparent conductive film 9. The low refractive index dielectric layer 10 may be made of material having the refractive index which is greater than the refractive index of the transparent conductive film 9. The material which satisfies the above requirement is exemplified by $TiO_2$, $CeO_2$, $Nb_2O_5$, and $Ta_2O_5$. However, the low refractive index dielectric layer 10 is preferred to be made of material of $SiO_2$, $ZrO_2$, $Al_2O_3$, and $Y_2O_3$ each of which has a refractive index which is lower than the refractive index of $TiO_2$, $CeO_2$, $Nb_2O_5$, and $Ta_2O_5$. This is because the low refractive index dielectric layer 10 being made of $SiO_2$, $ZrO_2$, $Al_2O_3$, and $Y_2O_3$ has a light reflectivity which is higher than the light reflectivity of the low refractive index dielectric layer 10 being made of $TiO_2$, $CeO_2$, $Nb_2O_5$, and $Ta_2O_5$.

In accord with the above, the simulation with regard to the incident angle dependence of the light reflectivity with respect to the low refractive index dielectric layer 10 is performed by using the low refractive index dielectric layer 10 having the condition which is explained below. The low refractive index dielectric layer 10 is made of material which is selected from one of the group of $SiO_2$, $ZrO_2$, $Al_2O_3$, $Y_2O_3$, $TiO_2$, $CeO_2$, $Nb_2O_5$, and $Ta_2O_5$. The low refractive index dielectric layer 10 is designed to have its refractive index which is represented as "n". The nitride light emission layer 3 is designed to emit the light having an emission wavelength of λ (nm). A various kinds of the low refractive index dielectric layers 10 having the thickness equal to integral multiple of λ/4 n is used to perform the simulation for obtaining the incident angle dependence of the light reflectivity with respect to the low refractive index dielectric layer 10. As a result, when the low refractive index dielectric layer 10 is set to have the thickness which is equal to or more than five-quarters of the emission wavelength of the light which is emitted from the nitride light emission layer 3, it was confirmed that decrease of the light reflectivity with respect to a predetermined incident angle caused by the evanescent light is inhibited. That is to say, if the low refractive index dielectric layer 10 satisfies the condition of having a thickness which is five-quarters or more greater than the optical wavelength (λ/n) of the emission wavelength of the nitride light emission layer 3, the improvement of the light extraction efficiency is confirmed. In addition to the above, when the low refractive index dielectric layer 10 is realized by the stacked film which comprises the $SiO_2$ layer 10a and the $ZrO_2$ layer 10b, it is desired to satisfy the following condition. The thickness of $SiO_2$ layer 10a is defined as "t1". The refractive index of $SiO_2$ layer 10a is defined as "n1". The thickness of $ZrO_2$ layer 10b is defined as "t2". The refractive index of $ZrO_2$ is defined as "n2". Under these conditions, the formula of $(t1 \times \lambda/4 \, n1 + t2 \times \lambda/4 \, n2) \geq (5/4)\lambda$ is satisfied. In this embodiment, the low refractive index dielectric layer 10 comprises the $SiO_2$ layer 10a to have a thickness t1 which is equal to 31.1 nm and the ZrO$_2$ layer 10b to have a thickness t2 which is equal to 159.1 nm such that the low refractive index dielectric layer 10 has an internal stress of zero. That is to say, if the low refractive index dielectric layer is realized by the above explained stacked film, the low refractive index dielectric layer 10 may have a SiO$_2$ layer 10a and a ZrO$_2$ layer 10b each of which is designed to have an appropriate thickness, whereby it is possible to improve the reflectivity of the low refractive index dielectric layer. Further, when the low refractive index dielectric layer 10 is realized by the above explained stacked layer, it is possible to relax the internal stress of the low refractive index dielectric layer 10 by designing the thicknesses of the SiO$_2$ layer 10a and the ZrO$_2$ layer 10b, arbitrarily. As a result, it is possible to improve the adhesiveness between the low refractive index dielectric layer 10 and the transparent conductive film 9.

In addition, LED chip A has a light transmissive substrate 1 which has a rectangular shape (a square shape) in the planar view. In other words, the LED chip A has the light transmissive substrate 1 to have a rectangular shape (square shape) along a direction perpendicular to the thickness direction of the LED chip A. The anode electrode 7 has a shape in the planar view of the rectangular shape (the square shape); the shape in the planar view of the anode electrode 7 is slightly smaller than the light transmissive substrate 1 to have at its one of the four corners with a cutout. In other words, the LED chip A has the anode electrode 7 which has the one surface along the direction perpendicular to the thickness direction of the LED chip A; the one surface of the anode electrode 7 is slightly smaller than the light transmissive substrate 1. In addition, the anode electrode 7 has the four corners; one of the four corners is provided with the cutout. The cathode electrode 8 has a rectangular shape in the planar view to be located within the cutout of the anode electrode 7. In other words, the cathode electrode 8 has one surface along the plane perpendicular to the thickness direction of the LED chip A. The cathode electrode 8 has a dimension such that the cathode electrode is located within the cutout of the anode electrode. In addition, the anode electrode 7 has a dimension which is greater than the dimension of the cathode electrode. In other words, the anode electrode 7 has the one surface which is greater than the one surface of the cathode electrode. It is noted that the shape of each one of the anode electrode 7 and the cathode electrode 8 is not limited thereto.

In addition, the LED chip A further comprises a plurality of the low refractive index dielectric layers 10 which has an arrangement which resembles an island of being isolated from each other; the low refractive index dielectric layers 10 are arranged on the transparent conductive film 9. Each one of the low refractive index dielectric layer 10 has an approximately circular shape in the planar view. In other words, the low refractive index dielectric layer 10 has a circular cross section which is perpendicular to the thickness direction of the LED chip. Therefore, in each one of the low refractive index dielectric layer 10, the low refractive index dielectric layer 10 has a center and an outer circumference which make an approximately constant distance from the center of the low refractive index dielectric layer 10. As a result, the light reflective conductive film 11 has a portion which surrounds an entire of the low refractive index dielectric layer 10. Consequently, it is possible to improve the uniformity of the electrical current density of the portion of the light reflective conductive film 11 which surrounds the entire of the low refractive index dielectric layer 10. It is noted that the low refractive index dielectric layer 10 has the circular shape in the planar view. However, it is possible to employ the low refractive index dielectric layer 10 having the regular polygon in the planar view; the regular polygon has equal to or more than six corners. In addition, it is desired to employ the low refractive index dielectric layer 10 having the regular polygon in the planar view such that the regular polygon has a plurality of the corners and such that the regular polygon has a shape approximately equivalent to the circular shape.

In addition, this embodiment discloses the LED chip A which comprises a plurality of the low refractive index dielectric layers on the transparent conductive film 9; a plurality of the low refractive index dielectric layers 10 are arranged in two dimensional arrays. However, it is preferred that the low refractive index dielectric layers 10 have a plane area which is equal to or less than 70 percents of a plane area of the transparent conductive film 9. With this configuration, the increase of the operation voltage (forward voltage) which is caused by the low refractive index dielectric layers 10 is inhibited. In addition, it is possible to improve the light extracting efficiency. In the above embodiment, the low refractive index dielectric layer 10 has a circular shape, as explained in the above, in planar view, and has a diameter of 5 micrometers. However, the numerical value is only one example. Therefore, the numerical value is not limited to the above numerical value.

Furthermore, this embodiment discloses the LED chip A which comprises the transparent conductive film 9. The anode electrode 7 has regions each of which is connected to the bump 37. The transparent conductive film 9 has first regions each of which is overlapped with the region of the bumps 37 which is connected to the anode electrode 7. Each one of the first regions is slightly greater than the region of the bump 37. Any one of the low refractive index dielectric layers 10 is not provided within each one of the first regions 12 so as not to be overlapped with the first region. In addition, the p-type nitride semiconductor layer 4 has a first region 12. The anode electrode 7 has regions each of which is connected to the bump 37. Each one of the first regions 12 of the p-type nitride semiconductor layer 4 is slightly greater than each one of the regions of bumps which are connected to the anode electrode 7. Each one of the low refractive index dielectric layers 10 is not provided within each one of the first regions 12 of the p-type nitride semiconductor layer 4. In other words, the transparent film 9 has a first region 12. The first region 12 of the transparent conductive film 9 is defined by the plane which is perpendicular to the thickness direction of the transparent conductive film. Furthermore, the first region 12 of the transparent conductive film 9 is defined by a plane which is perpendicular to the thickness direction of the p-type nitride semiconductor layer 4. The transparent conductive film 9 is formed on the p-type nitride semiconductor layer 4. Therefore, the p-type nitride semiconductor layer 4 also has the first region 12. The first regions 12 of the p-type nitride semiconductor layer 4 are defined by the planes which are perpendicular to the thickness direction of the p-type nitride semiconductor layer. Each one of the first region 12 of the transparent conductive film 9 is overlapped with the bump 37 in the thickness direction of the transparent conductive film. Each one of the first region 12 of the p-type nitride semiconductor layer 4 is overlapped with the bump 37 in the thickness direction of the p-type nitride semiconductor layer 4. Each one of the first region 12 has a dimension which is perpendicular to the thickness direction of the transparent conductive film 9; each one of the bump 37 has a dimension which is perpendicular to the thickness direction of the transparent conductive film 9; the dimension of the first region 12 is greater than the dimension of the bump 37. In addition to the above, the LED chip A has the first regions 12 each of which has a circular shape in the planar view. Each one of the bumps 37 which is connected to the anode electrode 7 has a projection domain in the planar view; each of the projection domains is located within the first region 12. In other words, each one of the bumps 37 which is connected to the anode electrode 7 has the outer circumference; an entire of the outer circumference of each one of the bumps 37 is located in an inside of the outer circumference of the first region 12. However, each one of the first region 12 is only required to be overlapped with "the region of each one of the bumps 37" in the thickness direction of the transparent conductive film 9. It is noted that the shape in the planar view of the first region 12 is defined by a portion which is surrounded by the low refractive index dielectric layers 10. In this embodiment, each one of the bumps 37 which is connected to the anode electrode 7 is formed to have a diameter of 80 micrometers in the cross section. The first region 12 is formed to have a diameter of 100 micrometer. However, the numerical values of the above diameters are disclosed as an example. Therefore, the numerical values of the above diameters are not limited to the above numerical values.

As will be understood from the above explanation, the light emitting device in this embodiment comprises the transparent conductive film 9, the light reflective conductive film 11, and a plurality of the low refractive index dielectric layers 10 which has an arrangement which resembles the islands to be isolated from each other. The LED chip A is shaped to have the transparent conductive film 9 which is interposed between the p-type nitride semiconductor layer 4 and the anode electrode 7. The transparent conductive film 9 is disposed in a position opposite of the nitride light emission layer 3 from the p-type nitride semiconductor layer 4. The transparent conductive film 9 has a refractive index which is smaller than the refractive index of the p-type nitride semiconductor layer 4. The light reflective conductive film 11 is located in a position opposite of the p-type nitride semiconductor layer 4 from the transparent conductive film 9. The light reflective conductive film 11 has the electrical conductivity, and is configured to reflect the light which is emitted from the nitride light emission layer 3. The low refractive index dielectric layers 10 are formed between the transparent conductive film 9 and the light reflective conductive film 11 to be located on the transparent conductive film 9, partially. The low refractive index dielectric layers 10 have the refractive index which is smaller than the refractive index of the p-type nitride semiconductor layer 4. With this configuration, it is possible to produce the LED chip A which has a high light extracting efficiency. In addition to the above configuration, the transparent conductive film 9 has the first regions 12. The first region is overlapped with each one of the bumps 37 in the thickness direction of the transparent conductive film. Any one of the low refractive index dielectric layers 10 are not formed in the first region 12 so as not to be overlapped with the first region 12. With this configuration, it is possible to reduce the thermal resistance between the LED chip A and the mounting substrate 20. That is to say, this configuration makes it possible to improve the heat radiating property of the LED chip A. In addition to the above improvement, this configuration makes it possible to increase the operating electrical current of the LED chip A.

In addition to the above configuration, this embodiment discloses the light emitting device which has the first region 12 which is explained in the above; the first region 12 has a circular shape in the planar view. The anode electrode 7 is connected to each one of the bumps 37 such that each one of the bumps 37 has the projection domain in the thickness direction; the projection domain is located within the first region 12. Therefore, this configuration makes it possible to increase the density of an arrangement of the low refractive index dielectric layer 10, compared with a case where the first region 12 has the rectangular shape in the planar view. As a result, this configuration makes it possible for the LED chip A to improve the light extracting efficiency.

In addition, FIG. 1B discloses the LED chip A which comprises the low refractive index dielectric layers 10; each one of the low refractive index dielectric layers 10 is arranged on the transparent conductive film 9 to be located on the lattice point of the two dimensional square lattice (which is imaginary) which has a unit cell having a square shape. However, it is possible to arrange each one of the low refractive index dielectric layers 10 to be located on a lattice point of the two dimensional triangle lattice (which is imaginary) which has a unit cell having a regular triangle shape. In this case, the low refractive index dielectric layers 10 are arranged to be spaced from the adjacent low refractive index dielectric layer 10 by the same distance. As a result, it is possible to improve the uniformity of the electrical current density, whereby it is possible to improve the luminescent efficiency.

In addition, it is possible for the light emitting device in FIG. 1A to omit the transparent conductive film 9 and the light reflective conductive film 11. In this case, the LED chip A comprises the p-type nitride semiconductor layer 4, the anode electrode 7, and the low refractive index dielectric layers 10 between the p-type nitride semiconductor layer 4 and the nitride light emission layer 5. The low refractive index dielectric layers 10 are partially disposed in a position opposite of the nitride light emission layer 5 from the p-type nitride semiconductor layer 4. The low refractive index dielectric layers 10 have the refractive index which is smaller than the refractive index of the p-type nitride semiconductor layer 4. The low refractive index dielectric layers 10 have an arrangement which resembles the islands to be isolated from each other. In this case, the p-type nitride semiconductor layer 4 has the regions which are overlapped with the bumps 37 in the thickness direction of the p-type nitride semiconductor layer; the region is defined as the first region 12. This configuration makes it possible for the light emitting device to improve the light extracting efficiency of the LED chip A. In addition, the LED chip A comprises the p-type nitride semiconductor layer 4 which has the first region 12 being defined by the region which is overlapped with each one of the bumps 37 in the thickness direction of the p-type nitride semiconductor layer. Therefore, this configuration makes it possible to improve the heat radiation property between the LED chip A and the mounting substrate 20, and also improve the luminescent efficiency.

Second Embodiment

Figure 2A:
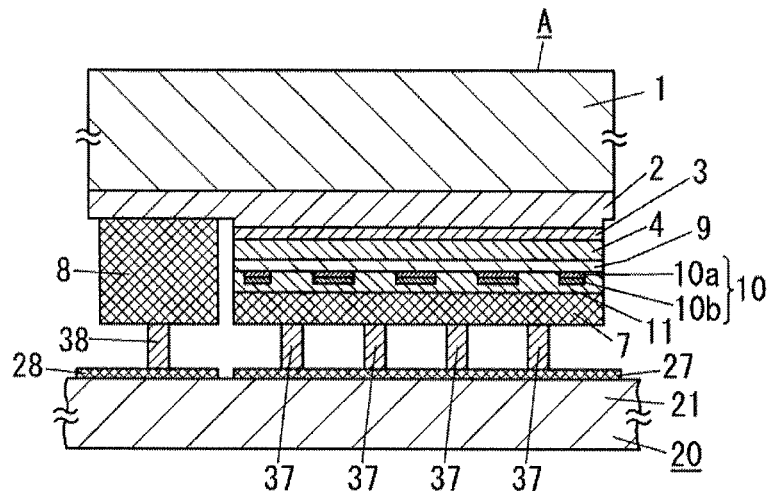
FIG. 2A shows a schematic side cross sectional view of the light emitting device of the second embodiment.

The light emitting device in this embodiment is approximately equivalent to the first embodiment. As will be understood from FIG. 2, the LED chip A comprises the transparent conductive film 9, the light reflective conductive film 11, and the low refractive index dielectric layer 11 between the transparent conductive film 9 and the light reflective conductive film 11; the light reflective conductive film 11 is partially disposed on the transparent conductive film 9 and has a refractive index which is smaller than the refractive index of the p-type nitride semiconductor layer 4. The difference of the light emitting device in this embodiment from that in the first embodiment is that the light emitting device in this embodiment comprises singular low refractive index dielectric layer 10, instead of a plurality of the low refractive index dielectric layers 10. The low refractive index dielectric layer 10 in this embodiment is provided with openings each of which has a circular shape; each one of the openings has a size greater than the projection domain of each one of the bumps 30; each one of the openings is located in a portion corresponding to at least each one of the bumps 37. In other words, the low refractive index dielectric layer 10 has circular shaped openings which have an opening size greater than the size of the cross section of the bump 37; the size of the cross section of the bump 37 is defined by a size of the cross section perpendicular to the thickness direction of the bump 37. It is noted that the components same as the components of the first embodiment are symbolized by the same reference, and are omitted its explanations.

Therefore, the light emitting device in this embodiment comprises the LED chip A which has a p-type nitride semiconductor layer 4, the anode electrode 7, the transparent conductive film 9, the light reflective conductive film 11, and the low refractive index dielectric layer 10. The transparent conductive film 9 is disposed in a position opposite of the nitride light emission layer 3 from the p-type nitride semiconductor layer 4. The transparent conductive film 9 has a refractive index which is smaller than the refractive index of the p-type nitride semiconductor layer 4. The light reflective conductive film 11 is disposed on a position opposite of the p-type nitride semiconductor layer 4 from the transparent conductive film 9. The light reflective conductive film 11 has an electrical conductivity, and is configured to reflect the light which is emitted from the nitride light emission layer 3. The low refractive index dielectric layer 10 is disposed between the transparent conductive film 9 and the light reflective conductive film 11. The low refractive index dielectric layer 10 is partially formed on the transparent conductive film. The low refractive index dielectric layer 10 has a refractive index which is smaller than the refractive index of the p-type nitride semiconductor layer 4. Consequently, it is possible to improve the light extracting efficiency of the LED chip A. In addition to the above, the LED chip A comprises the transparent conductive film 9 such that the transparent conductive film 9 has a first region 12 which is defined by the region being overlapped with each one of the bumps 37 in the thickness direction of the transparent conductive film 9. Therefore, this configuration makes it possible to decrease the thermal resistance between the LED chip A and the mounting substrate 20. In addition, this configuration makes it possible to increase the operating current. As a result, it is possible to improve the luminescent efficiency.

Figure 2B:
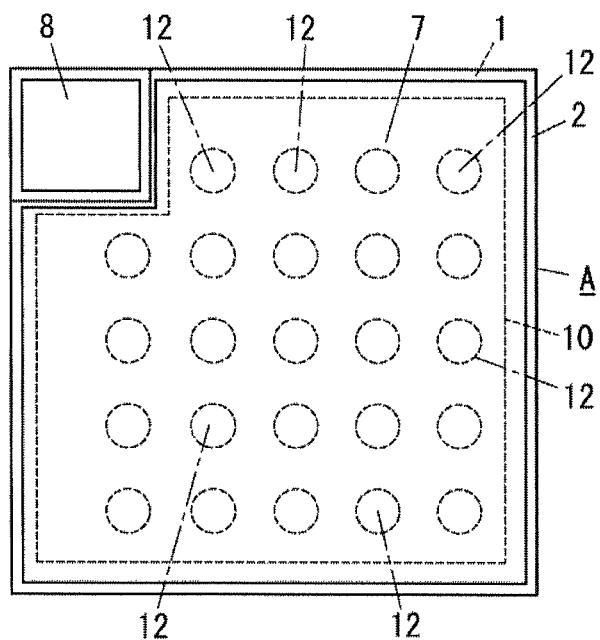
FIG. 2B shows a schematic bottom view of the light emitting device of the second embodiment.
Figure 3A:
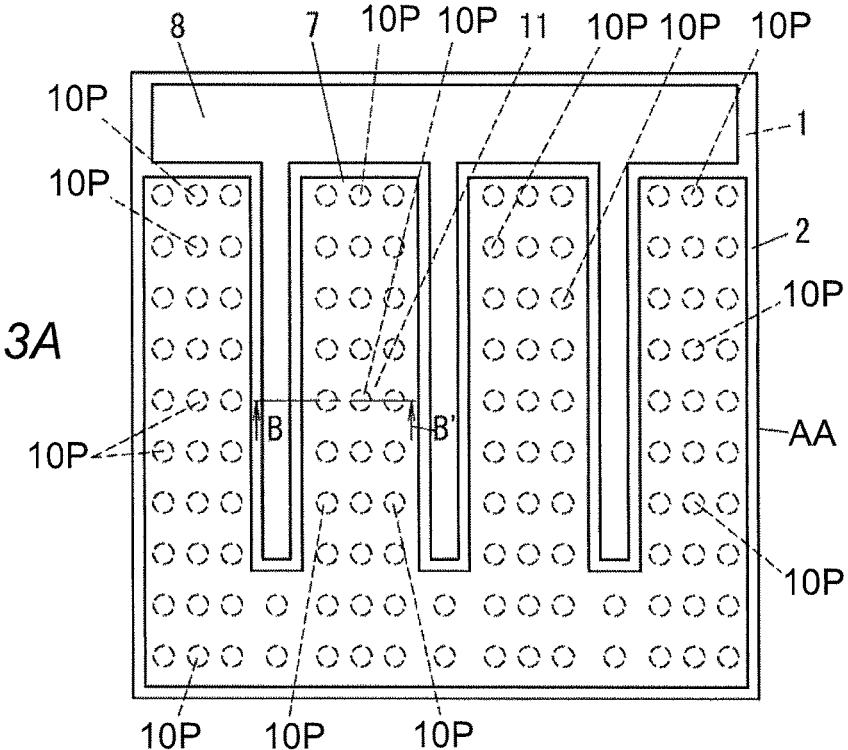
FIG. 3A shows a schematic bottom view of the LED chip of the prior art.
Figure 3B:
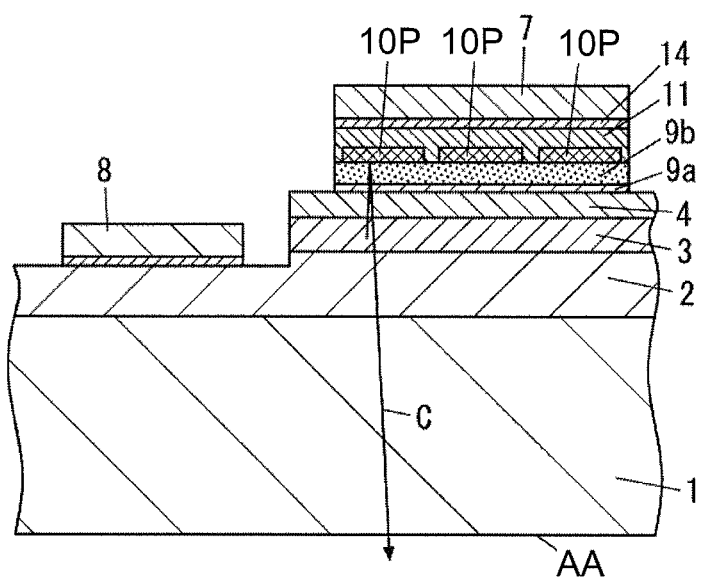
FIG. 3B shows a schematic cross sectional view which is taken along the B-B' line of the LED chip in FIG. 3A.

In addition, it is possible to reduce the transparent conductive film 9 and the light reflective conductive film 11 from the light emitting device of FIG. 2B. In this case, the LED chip A comprises the p-type nitride semiconductor layer 4, the anode electrode 7, and the single low refractive index dielectric layer 10 between the p-type nitride semiconductor layer 4 and the anode electrode 7. The single low refractive index dielectric layer 10 is partially disposed on a position opposite of the nitride light emission layer 5 from the p-type nitride semiconductor layer 4. The single low refractive index dielectric layer 10 has a refractive index which is lower than the refractive index of the p-type nitride semiconductor layer 4. The low refractive index dielectric layer 10 is disposed on the first region of the p-type nitride semiconductor layer 4; the first region is defined by a region which is overlapped with at least each one of the bumps 37. With this configuration of the light emitting device, it is possible to improve the light extracting efficiency of the LED chip A. Furthermore, LED chip A comprises the p-type nitride semiconductor layer 4 which has the region which is overlapped with each one of the bumps 37; the region which is overlapped with each one of the bumps 37 is defined as the first region 12. Consequently, it is possible to decrease the thermal resistance between the LED chip A and the mounting substrate 20, to improve the heat radiation property, and to improve the luminescent efficiency.

In the above embodiments, the LED chip A is designed to emit the light having a blue color. However, the color of the light emitted from the LED chip A is not limited to the blue color. That is, it is possible to design the LED chip to emit the light having green color, red color, violet color, ultraviolet color, and so on.

Furthermore, the light emitting device explained in the above embodiments may employ the color conversion member having a dome shape (not shown in the illustrations). In this case, the color conversion member is made of translucent material with the phosphor. When the phosphor receives the light from the LED chip A, the phosphor is configured to be excited to emit the light having a wavelength which is longer than the wavelength of the light which is emitted from the LED chip A. The color conversion member is mounted on the mounting substrate 20 such that the LED chip A is located between the color conversion member and the mounting substrate 20. In this case, the translucent material for the color conversion member is exemplified by a silicone resin. However, the translucent material is not limited to the silicone resin. That is, it is possible to use acrylic resin, glass, and organic-inorganic hybrid material that the organic component and inorganic component are mixed and coupled in nanometer level or molecule level. To employ the glass makes it possible to improve the heat conductivity of the color conversion member, compared with a case where the silicone resin is employed. Consequently, it is possible to prevent the increase of the temperature of the phosphor, and increase the light flux. Furthermore, to employ the glass makes it possible to improve the gas barrier property of preventing the water vapor and the $NO_x$ and to improve the moisture permeability. In addition, to employ the glass makes it possible to prevent the degradation of the phosphor due to the moisture absorption. As a result, it is possible to improve the reliability and the durability. In addition, the color conversion member is designed to comprise the translucent material with the yellow phosphor. However, the phosphor is not limited to the yellow phosphor. That is, it is possible to use the combination of the red phosphor and the green phosphor to obtain the white light.

The invention claimed is:

1. A light emitting device comprising:
an LED chip and a mounting substrate,
said LED chip comprising an n-type nitride semiconductor layer, a nitride light emission layer, a p-type nitride semiconductor layer, an anode electrode, and a cathode electrode,
said n-type nitride semiconductor layer having a first surface,
said nitride light emission layer being disposed on said first surface of said n-type nitride semiconductor layer,
said p-type nitride semiconductor layer being disposed on said nitride light emission layer,
said anode electrode being opposite of said nitride light emission layer from said p-type nitride semiconductor layer and covering said p-type nitride semiconductor layer,
said cathode electrode being disposed on said first surface of said n-type nitride semiconductor layer,
said mounting substrate being configured to mount said LED chip,
said mounting substrate having a first patterned conductor which is coupled to said cathode electrode through a cathode bump and a second patterned conductor which is electrically and physically connected to anode bumps, said anode bumps being electrically and physically connected to said anode electrode, said LED chip comprising dielectric layers which have an arrangement which resembles an island and a light reflective conductive film covering said dielectric layers, said dielectric layers having a refractive index which is smaller than a refractive index of said p-type nitride semiconductor layer, said dielectric layers being located between said p-type nitride semiconductor layer and said anode electrode, said p-type nitride semiconductor layer having first regions which are overlapped with said anode bumps in a planer view, respectively, said dielectric layers being not overlapped with said first regions, said light reflective conductive film being located between said anode electrode and said dielectric layers, and said anode electrode does not penetrate said light reflective conductive film.

2. The light emitting device as set forth in claim 1, wherein said LED chip further comprises a transparent conductive film, said transparent conductive film being disposed between the said p-type nitride semiconductor layer and said anode electrode, said transparent conductive film having a refractive index which is lower than the refractive index of said p-type nitride semiconductor layer, said light reflective conductive film being disposed between said transparent conductive film and said anode electrode, said dielectric layers being partially formed on said transparent conductive film, said dielectric layers having the arrangement which resembles the island, and said dielectric layers being formed between said transparent conductive film and said light reflective conductive film.

3. The light emitting device as set forth in claim 1, wherein each of said first regions is a plane which is perpendicular to a thickness direction of said p-type nitride semiconductor layer, said plane having a circular shape, said first regions being overlapped with said anode bumps, respectively, in the thickness direction of said p-type nitride semiconductor layer.

4. The light emitting device as set forth in claim 2, wherein each of said first regions is a plane which is perpendicular to a thickness direction of said p-type nitride semiconductor layer, said plane having a circular shape, said first regions being overlapped with said anode bumps, respectively, in the thickness direction of said p-type nitride semiconductor layer.

5. The light emitting device as set forth in claim 1, wherein each of said dielectric layers has a two-layer structure.

6. The light emitting device as set forth in claim 1, wherein each of said dielectric layers includes a silicon oxide layer and a zirconium oxide layer.

7. The light emitting device as set forth in claim 1, wherein each of said first regions is surrounded by said dielectric layers.

8. The light emitting device as set forth in claim 1, wherein said dielectric layers are arranged to be spaced from an adjacent dielectric layer by the same distance.

9. The light emitting device as set forth in claim 7, wherein said dielectric layers are arranged to be spaced from an adjacent dielectric layer by the same distance.

10. A light emitting device comprising:

an LED chip and a mounting substrate, said LED chip comprising an n-type nitride semiconductor layer, a nitride light emission layer, a p-type nitride semiconductor layer, an anode electrode, and a cathode electrode, said n-type nitride semiconductor layer having a first surface, said nitride light emission layer being disposed on said first surface of said n-type nitride semiconductor layer, said p-type nitride semiconductor layer being disposed on said nitride light emission layer, said anode electrode being opposite of said nitride light emission layer from said p-type nitride semiconductor layer and covering said p-type nitride semiconductor layer, said cathode electrode being disposed on said first surface of said n-type nitride semiconductor layer, said mounting substrate being configured to mount said LED chip, said mounting substrate having a first patterned conductor which is coupled to said cathode electrode through a cathode bump and a second patterned conductor which is electrically and physically connected to anode bumps, said anode bumps being electrically and physically connected to said anode electrode, said LED chip comprising a dielectric layer having openings and a light reflective conductive film covering said dielectric layer, said dielectric layer having a refractive index which is smaller than a refractive index of said p-type nitride semiconductor layer, said dielectric layer being located between said p-type nitride semiconductor layer and said anode electrode, in a planer view, said anode bumps overlapping with said openings, respectively, and not overlapping with said dielectric layer, said anode electrode not directly contacting said p-type nitride semiconductor layer, said light reflective conductive film being located between said dielectric layer and said anode electrode, and said anode electrode does not penetrate said light reflective conductive film.

11. The light emitting device as set forth in claim 10, wherein each of said dielectric layers has a two-layer structure.

12. The light emitting device as set forth in claim 10, wherein each of said dielectric layers includes a silicon oxide layer and a zirconium oxide layer.

\* \* \* \* \*